United States Patent [19]
Fang et al.

[11] Patent Number: 5,994,776
[45] Date of Patent: Nov. 30, 1999

[54] INTERLEVEL DIELECTRIC WITH MULTIPLE AIR GAPS BETWEEN CONDUCTIVE LINES OF AN INTEGRATED CIRCUIT

[75] Inventors: Peng Fang, San Jose; Homi Fatemi, Los Altos Hills, both of Calif.

[73] Assignee: Advanced Micro Devices, Inc., Sunnyvale, Calif.

[21] Appl. No.: 09/063,481

[22] Filed: Apr. 20, 1998

Related U.S. Application Data

[63] Continuation of application No. 08/584,353, Jan. 11, 1996, abandoned.

[51] Int. Cl.⁶ .......................... H01L 23/48; H01L 23/52; H01L 29/40
[52] U.S. Cl. .......................... 257/758; 257/760; 438/622; 438/624
[58] Field of Search .................................. 257/758, 760, 257/632; 438/618, 619, 622, 624

[56] References Cited

U.S. PATENT DOCUMENTS

| | | | |
|---|---|---|---|
| 5,124,014 | 6/1992 | Foo et al. ............................ | 438/694 |
| 5,275,977 | 1/1994 | Otaubo et al. ...................... | 438/695 |
| 5,407,860 | 4/1995 | Stoltz et al. ........................ | 438/619 |
| 5,461,003 | 10/1995 | Havemann et al. ................ | 438/666 |
| 5,468,685 | 11/1995 | Orisaka et al. ..................... | 438/694 |
| 5,470,801 | 11/1995 | Kapoor et al. ..................... | 438/471 |
| 5,471,093 | 11/1995 | Cheung ............................... | 257/758 |
| 5,476,817 | 12/1995 | Numata ............................... | 438/619 |
| 5,519,250 | 5/1996 | Numata ............................... | 257/632 |
| 5,548,159 | 8/1996 | Jeng .................................... | 257/634 |

*Primary Examiner*—Mahshid Saadat
*Assistant Examiner*—Allan R. Wilson
*Attorney, Agent, or Firm*—Foley & Lardner

[57] ABSTRACT

A method of forming low dielectric insulation between pairs of conductive lines separated by insulating material of a level of interconnection for integrated circuits by selectively removing portions of the insulating material to create spaces for containing a gas with a dielectric constant of slightly above 1. Preferably, the insulating material is a conformal source of silicon oxide, such as tetraethylorthosilicate. The resultant method forms an insulation separating the conductive lines whose composite dielectric constant with the gas in the spaces between the insulating material is not greater than about 3 over a predetermined distance. An integrated circuit having a plurality of semiconductor devices being interconnected by conductive lines separated by insulating material and spaces containing a gas, composite dielectric constant of which is not greater than about 3 over a predetermined distance.

10 Claims, 5 Drawing Sheets

INTERLEVEL DIELECTRIC WITH MULTIPLE AIR GAPS BETWEEN CONDUCTIVE LINES OF AN INTEGRATED CIRCUIT

The present application Ser. No. 09/063,481, filed Apr. 20, 1998, is a continuation of application Ser. No. 08/584,353 filed Jan. 11, 1996 now abandoned.

FIELD OF THE INVENTION

This invention relates to the fabrication of integrated circuit semiconductor devices and more particularly, to forming a low dielectric constant insulation between metal conductive lines which provide the interconnection between the active and/or passive elements of the integrated circuit, and further relates to the novel integrated circuit semiconductor device structures resulting therefrom.

BACKGROUND OF THE INVENTION

In very large scale integrated (VLSI) circuit devices, several wiring layers are required to connect together the active and/or passive elements in a VLSI semiconductor chip. The interconnection structure consists of thin conductive lines separated by insulation in one layer or level and connected through vias or studs from contacts of the elements of the semiconductor chip or to a similar layer in another level of interconnections. This interconnection structure is similar to a transmission line in that there is a propagation delay of the signals being transmitted in these wiring layers. The delay is referred to as RC delay because it is a result of the resistance (R) of the material of the wire and the capacitance (C) between adjacent wires. With the trend of higher and higher levels of integration in semiconductor devices to ultra large scale integrated (ULSI) circuits, the space or gap between the wires or conductive lines to be filled with insulation is becoming extremely narrow between some of the conductive lines, such as those that are about 0.5 microns and smaller. Such a narrow space or gap between conductive lines increases the capacitance and places greater demands on the insulating properties of the insulation between such conductive lines. Capacitance (C) is the product of dielectric constant (DC) of the insulating material times the area (A) of the opposing faces of the conductive line divided by the distance (D) between the conductive lines. With a decrease in distance (D), the capacitance (C) increases. Since signal delay of signal transmitted on the conductive line is controlled by the RC constant, an increase in capacitance (C) degrades the performance of the integrated circuit.

At the present state of the art, the insulating material used to fill these gaps is a silicon containing compound, such as silicon dioxide, which has a dielectric constant (DC) of between 3.5 and 4.0. A vacuum has a perfect dielectric constant (DC) and is the basis for the measurement of the dielectric constant of other materials. For example, air and other insulating gases have a dielectric constant (DC) of slightly greater than 1, but less than 1.1. Air has a dielectric constant of 1.00059 and oxygen ($O_2$) has a dielectric constant of 1.000523. The use of insulating material with dielectric constants (DC) lower than 3.5 in the narrow gap will lower the capacitance (C) and offset the increase caused by the smaller distance (D) between adjacent conductive lines. Attempts have been made to use organic insulating materials, such as polyimides which have a DC of between 3.2–3.4, but these materials are hydroscopic and any absorbed moisture can potentially cause corrosion of metal lines. Other possible insulating materials are boron nitride ($BN_x$) and fluorinated silicon oxide ($SiO_xF_y$), but they also have dielectric constants above 3 and by themselves cannot achieve a lower dielectric constant.

In addition to the demands placed on the insulating property of the insulation between the conductive lines, these narrow gaps of about 0.5 microns and smaller make it much more difficult to deposit the insulating material into the gaps so that the gaps may not be completely and properly filled. In addition, when the height of the conductive line is increased, this increased height makes it still more difficult to fill, especially when the aspect ratio is 2 to 1 or greater with a gap distance of 0.5 microns or smaller. Aspect ratio is the height (h) of the conductive line divided by the distance (d) or gap between the conductive lines. It is pointed out in U.S. Pat. No. 5,124,014 to Pang-Dow Foo et al. that when the gap or distance (d) is less than the (h) of the conductive line, it is difficult to fill uniformly. U.S. Pat. No. 5,275,977 to Otsubo et al. confirms this problem and the inventors of both patents set the same objective for their processes; namely, the formation of the insulating film free of voids.

The disclosure in the Foo et al. patent describe a method for forming void free insulating layers between the conductive lines and it suggests that, from a detrimental standpoint, voids will form under certain conditions. However, this patent fails to recognize the advantage of voids surrounded by the insulating material in narrow gaps between conductive lines.

However, Ser. No. 08/478,315, filed Jun. 7, 1995, Ser. No. 08/481,906 filed Jun. 7, 1995 and Ser. No. 08/481,030 filed Jun. 7, 1995 and assigned to the same assignee do recognize the advantage of large voids surrounded by insulating material and describe and claim processes for creating a continuous void between at least narrow conductive lines.

SUMMARY OF THE PRESENT INVENTION

It is an object of the present invention to provide a method for disposing the insulating material between metal conductive lines such that at least the narrow gaps between the conductive lines has an overall significantly improved average dielectric constant.

Another object of the present invention is to provide a integrated circuit semiconductor device with a novel insulating structure between at least the narrow gaps of the conductive lines with the insulating structure having a significantly improved dielectric constant.

In accordance with the present invention, the method comprises: [filling gaps in a patterned surface of metal conductive lines with a conventional insulating material having a dielectric constant of not greater than about 4.0 with at least one pair of adjacent conductive lines having narrow gap,] patterning the insulating material in the gap between said adjacent conductive lines so that at least two narrow portions of the insulating material in the gap are exposed in the pattern, and removing the exposed narrow portions to leave at least two narrow spaces in the insulating material along the length of the pair of conductive lines, whereby the average dielectric constant of the insulation in the gap between the pair of conductive lines is not greater than about 3 and, preferably, is not greater than about 2. Either width or length dimension of the spaces of the insulating material is sufficiently narrow so that any subsequent insulating layer disposed on top of the conductive lines is prevented, by the narrow dimension, from filling the spaces. The spaces, however, are sufficient in number so that the average dielectric constant of the insulating material and the voids are not greater than about 3. Prior to patterning the insulating material, the conductive lines separated by insulation can be fabricated either by forming the conductive lines and filling the gaps between the lines or by forming the conductive line pattern in an insulating layer and filling the etched pattern with metal. This latter technique is known as damascene.

In accordance with another aspect of the present invention, an integrated circuit semiconductor device with interconnection levels having at least one narrow gap between a pair of conductive lines with such gap containing insulating material having a dielectric constant of not greater than about 4 and at least two spaces containing an insulating gas, such as air, with a dielectric constant of slightly greater than 1 but less than about 1.0001 dispersed between the insulating material and being of sufficient number relative to a size of not greater than $2\mu$ in the shortest dimension to yield an average dielectric constant of not greater than about 3.

The dimension of the spaces between the sides of the insulating material ranges between 0.5 and $2\mu$ and, preferably, is less than about $1\mu$. Although the shape of the spaces preferably is rectangular with the long dimension being perpendicular to the pair of conductive lines, they can be any shape such as triangular, cylindrical or any type of polygon. They also can be arranged at any angle relative to the pair of conductive lines and can be any of these shapes in a random pattern. In the rectangular form, the length dimension of the insulating material and the spaces is substantially perpendicular to the conductive lines and the width dimension is substantially parallel to the lines.

It will be recognized by those skilled in the art of the performance advantage gained by using the insulating material with a plurality of spaces along insulating material in the narrow gaps of conductive lines so as to achieve a composite lower dielectric constant and, hence, reduced capacitance.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS

Figure 1:
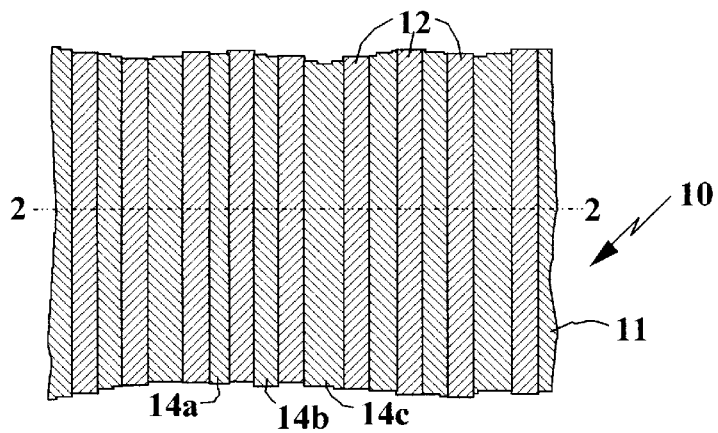
FIG. 1 is a plan view of a portion of a VLSI integrated circuit metallization layer during fabrication of a semiconductor chip prior to being covered with a layer of insulating material.
Figure 2:
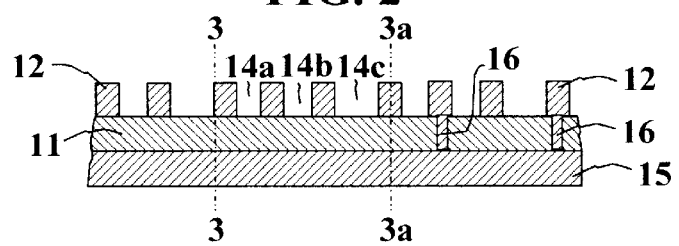
FIG. 2 is a cross-sectional view of the metallization layer taken along 2—2 of FIG. 1.
Figure 3:
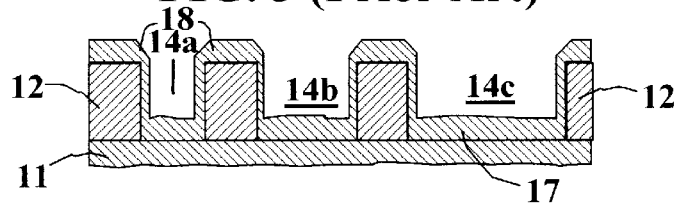
FIGS. 3, 4 and 5 are enlarged cross-sectional views of a section of FIG. 2 as indicated by vertical lines 3—3 and 3a—3a showing early, intermediate and final stages of a prior art method for coating an insulating layer on the metallization layer.
Figure 4:
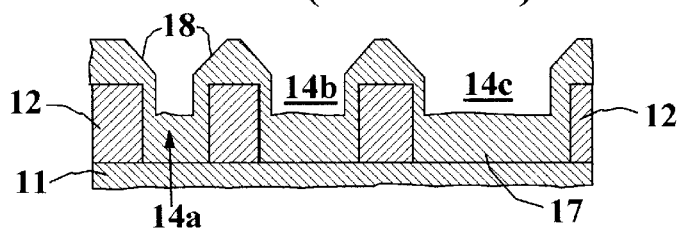
Figure 5:
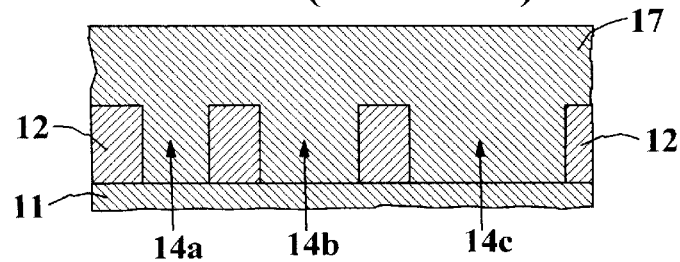

Referring now to the drawings and, more particularly to FIGS. 1 and 2, a portion of a partially complete metallization layer 10 is shown disposed on an insulating layer 11 and with a plurality of conductive lines 12 having narrow gaps or openings 14a, intermediate gaps 14b and wide gaps 14c between the conductive lines. A cross-section of this metallization layer 10 is shown in FIG. 2 and it includes a conductive line 15 in the underlying metallization layer with vias 16a and 16b connecting that conductive line with two of the lines of the metallization layer 10. An insulating material must be deposited in the gaps or openings 14 as shown in FIGS. 1 and 2 to complete the metallization layer 10. Heretofore, this was accomplished by chemical vapor deposition (CVD) of precursors of the insulating material, such as silane ($SiH_4$) and oxygen ($O_2$). Because of smaller gaps, such as 0.5 microns or less, between the conductive lines 12 and the possible formation of small voids in filling such narrow gaps, a present method uses the combination of simultaneously depositing and etching the insulating material to fill all of the gaps without any small voids. This method is shown in FIGS. 3, 4 and 5 at early, intermediate, and near final stages of filling the gaps 14a, 14b and 14c, respectively, between conductive lines 12 with a conformal insulating material 17, such as when the source of silicon is tetraethylorthosilicate (TEOS) or tetramethylcyclotetrasilane (TMCTS) to react with $O_2$. Either a single chamber plasma reactor or a dual chamber, such as an Electron Cyclotron Resonance (ECR) reactor are used to simultaneously deposit $SiO_2$ and etch the deposited $SiO_2$ with either $O_2$ or Argon (Ar) providing ions for sputter etching or an etching gas, such as carbon tetrafluoride ($CF_4$) for chemical etching. In the prior method using an ECR reactor, a conformal $SiO_2$ layer is deposited anisotropically or unidirectionally parallel to the sidewalls of the conductive lines 12 so as to minimize any buildup of the deposited $SiO_2$ on the shoulders 18 of the conductive lines as best shown in FIG. 3. In addition, the deposited $SiO_2$ is etched at approximately a 45° angle during deposition, which causes the shoulders 18 to take on a sloped appearance as shown in FIGS. 3, 4, and 5 and further reduces any possibility of deposited $SiO_2$ bridging over the gaps or openings 14a, 14b and 14c to create a void. Thus, the combination of conformal source material for the insulating layer, unidirectional deposition, and sputter or chemical etching provides void free insulation between and on top of the conductive lines 12. The dielectric constant of the insulation between the conductive lines is the sole dielectric constant of the deposited insulating material and, since it is $SiO_2$, the dielectric constant of the prior art insulating material between the narrow gap 14a is in the range of 3.5 to 4.

In accordance with the present invention, it has been discovered that voids within an insulating material are not detrimental in a narrow gap or opening 14a because the voids or spaces have a lower dielectric constant than any of the solid inorganic insulating materials, such as $SiO_2$, or even organic insulating materials, such as polyimide, and the combination of the solid insulating material and voids or spaces of the proper size and quantity yields a dielectric constant of not greater than 3. Voids or spaces in a gap or opening of 0.5 microns or less, such as 0.1 microns, with an aspect ratio of about 2 to 1 or greater relative to the conductive line's height provides a substantial improvement in the capacitance of the gap and thereby the RC delay of the conductive lines 12a and 12b on either side of the gap 14a. Although the need for a low dielectric constant is greatest in the narrow gap, such as 14a, the low dielectric constant is the wider gaps of 14b and 14c also is desirable.

Figure 6:
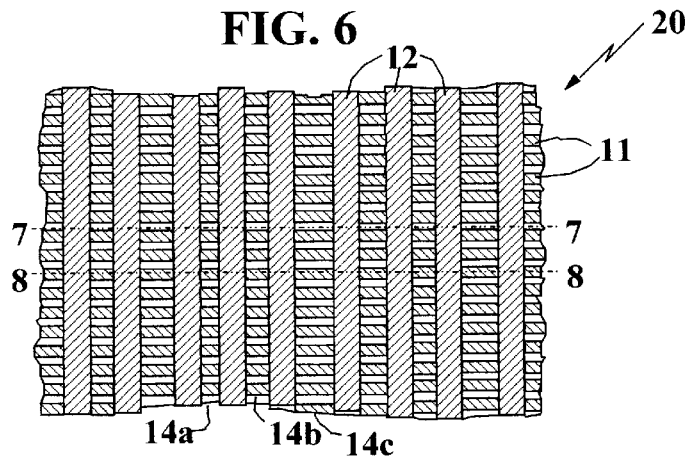
FIG. 6 is a plan view of a portion of a VLSI integrated circuit metallization layer during fabrication of a semiconductor chip after the gaps are filled with insulating material and formed with spaces.
Figure 7:
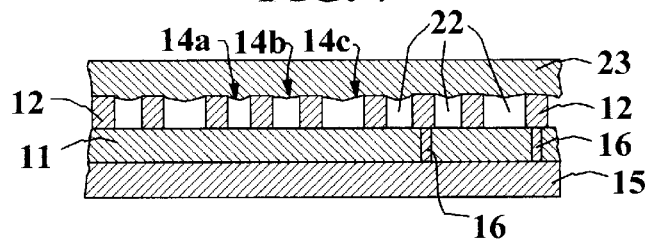
FIG. 7 is a cross-sectional view of the spaces in the gaps taken along 7—7 of FIG. 6.
Figure 8:
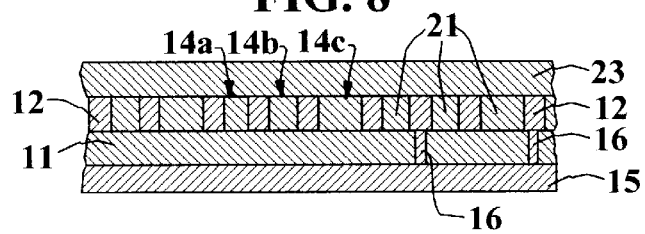
FIG. 8 is a cross-sectional view of the insulating material in the gaps taken along 8—8 of FIG. 6.

As shown in FIG. 6, an interconductive layer 20 the gaps or openings, such as 14a, 14b, and 14c, between pairs of conductive lines 12 are filled with patterned insulating material 21 having a plurality of spaces 22, each separated by the insulating material 21. Alternatively, the fabrication of the conductive lines 12 separated by insulation can be accomplished by depositing metal etched openings (not shown) in an insulating layer (now shown) by the damascene process. The dimension of spaces 22 between the sides of the insulating material is sufficiently narrow so that any subsequent insulating layer preferably from a nonconformal source, such as layer 23, disposed on top of the conductive lines only slightly sags into the space and is prevented, by the narrow dimension, from filling the spaces as shown in FIG. 7. In contrast, the portion of the gap between the conductive line filled with insulating material 21 supports any subsequent layer such as layer 23, as shown in FIG. 8. The spaces 22 are sufficient in number so that the average dielectric constant of the insulating material and the spaces is not greater than about 3. The dielectric constant of the insulating material 21, herein silicon oxide with a dielectric constant of 3.9, is not greater than about 4 and the spaces 22 contain an insulating gas with a dielectric constant of not greater than 2, such as air, with a dielectric constant of about 1.00059, and are of a size of about $2\mu$ in the width dimension for the spaces 22 and about $3\mu$ for the insulating material 21 to yield an average dielectric constant for the length of the gap of about 2.74.

The width dimension of the spaces 22 between the sides of the insulating material 21 normally ranges between 0.1 and $2\mu$ and, preferably, is less than about $1\mu$. Although the shape of the spaces preferably is rectangular with the long dimension being perpendicular to the pair of conductive lines, as shown in FIG. 6, they can be any shape such as triangular 22a, cylindrical 22b or any type of polygon 22c. They also can be arranged at any angle relative to the pair of conductive lines, such as 22d, and can be any of these shapes in a random pattern. To protect against hillocks or protrusion of the conductive metal into gaps without insulating material 21, the shape of the void can be centered in the gap between insulating material 21a and parallel to the conductive lines 12, such as void 22e in FIG. 6.

Figure 10:
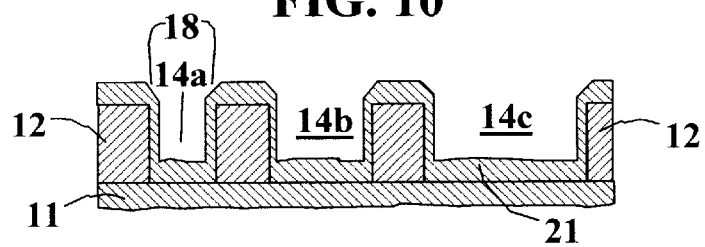
FIGS. 10, 11 and 12 are enlarged cross-sectional views of the same section of FIG. 2 as in FIG. 3 showing early, intermediate and final stages of a conventional method for filling the gaps in the metallization layer with insulating material.
Figure 11:
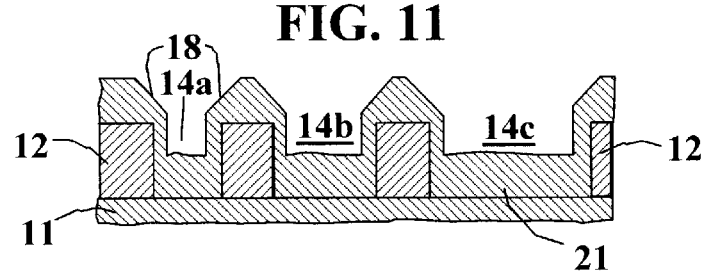
Figure 12:
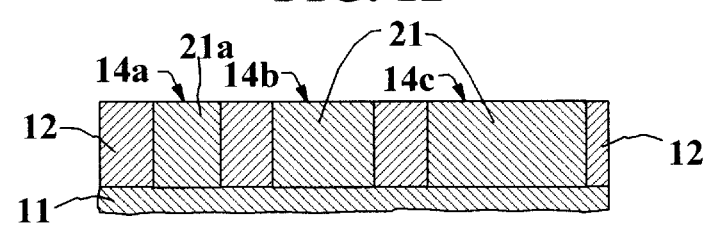
Figure 13:
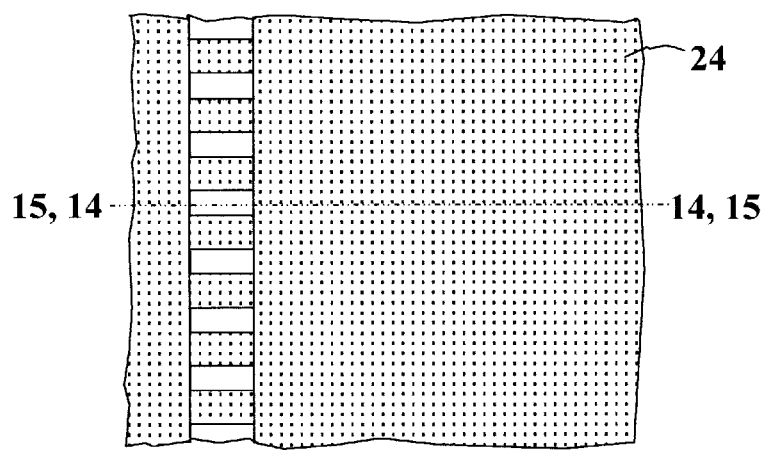
FIG. 13 is a partial plan view of a photoresist pattern for forming an etch pattern in insulating material in a narrow gap between a pair of conductive lines.
Figure 14:
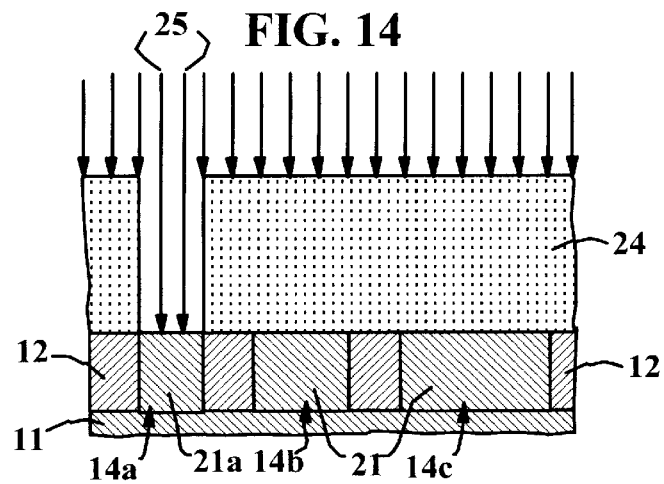
FIG. 14 is a cross-sectional view of pattern of FIG. 13 taken along 14—14 of FIG. 13 at the beginning of etching the insulating material.
Figure 15:
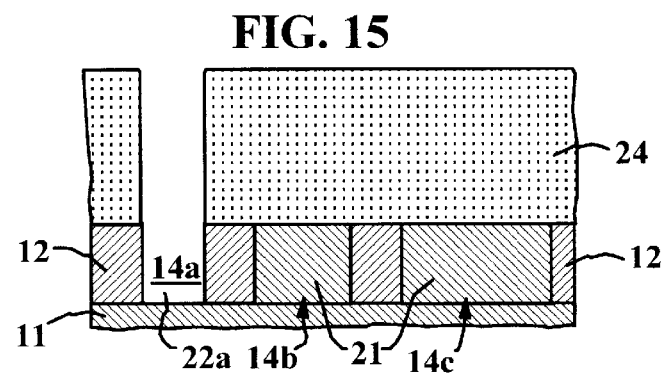
FIG. 15 is a cross-sectional view of pattern of FIG. 13 taken along 15—15 of FIG. 13 after etching the insulating material.
Figure 16:
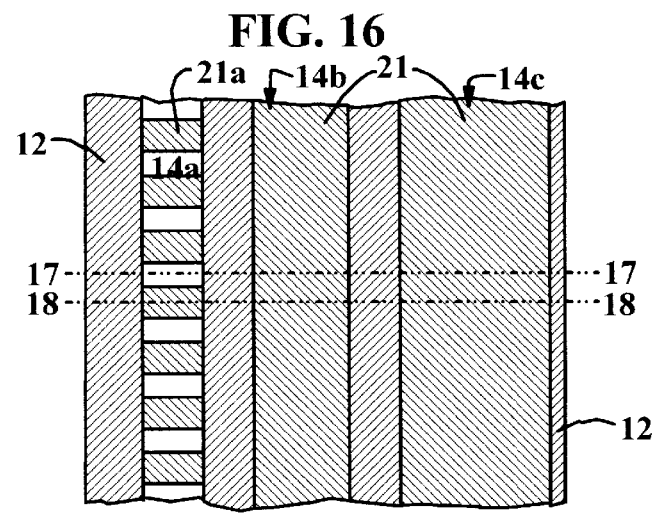
FIG. 16 is a partial plan view of the conductive lines filled with insulating material and with the narrow gap between the pair of conductive lines having repetitive portions of the insulating material removed.
Figure 17:
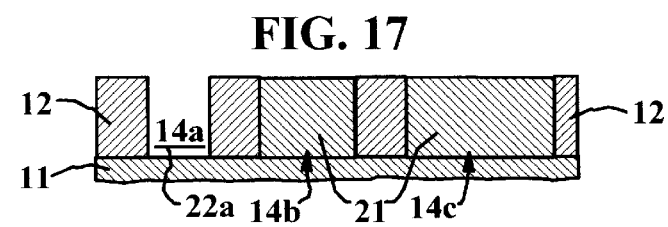
FIG. 17 is a cross-sectional view of FIG. 16 taken along 17—17 of FIG. 16.

A method of the present invention for achieving a insulating material containing a plurality of spaces of the proper size and number along the conductive lines 12a and 12b is shown sequentially in FIGS. 10, 11, 12, 13, 14, 15, 16, and 17. The interconnection structure at the start of the method is the same as FIG. 2 and the initial steps follow the prior art steps as shown in FIGS. 3–5 except that the deposited insulation is planarized at the top of the conductive lines 12 as shown in FIG. 12. Accordingly, in FIG. 10, which is an enlarged partial view of FIG. 2, a deposited and planarized insulating layer 11 is partially shown with a layer on conductive lines 12 disposed thereon and with gaps or spaces 14a, 14b, and 14c between the conductive lines 12. To fill the gaps or spaces 14a–c between the conductive lines 12, an insulating material 21, such as when the source of silicon is herein tetraethylorthosilicate (TEOS) but also may be tetramethylcyclotetrasilane (TMCTS) to react with $O_2$. A single chamber plasma reactor or, preferably, a dual chamber, such as an Electron Cyclotron Resonance (ECR) reactor is used to simultaneously deposit $SiO_2$ and etch the deposited $SiO_2$ with either $O_2$ or Argon (Ar) providing ions for sputter etching. If a single chamber plasma reactor is used, the depositing and etching step are performed sequentially and an etching gas, such as carbon tetrafluoride ($CF_4$) is used for chemical etching the deposited silicon oxide. In the preferred simultaneous method using an ECR reactor, a conformal $SiO_2$ layer is deposited anisotropically or unidirectionally parallel to the sidewalls of the conductive lines 12 so as to minimize any buildup of the deposited $SiO_2$ on the shoulders 18 of the conductive lines. In addition, the deposited $SiO_2$ is etched at approximately a 45° angle during deposition, which causes the shoulders 18 to take on a sloped appearance as shown in FIGS. 10 and 11 and further reduces any possibility of deposited $SiO_2$ bridging over the gaps or openings 14a, 14b and 14c to create a void. Thus, the combination of conformal source material for the insulating layer, unidirectional deposition, and sputter etching provides void free insulation between and on top of the conductive lines 12. The dielectric constant of the insulation between the conductive lines is the sole dielectric constant of the deposited insulating material and, since it is $SiO_2$, the dielectric constant of the insulating material between the narrow gap 14a is about 3.9. Alternatively, a damascene process (not shown), which is well known in the art can be used to fabricate an insulating layer with conductive lines.

After the deposited insulating material 21 is deposited, it is planarized to be coplanar with the tops of the conductive lines 12. Conventional chemical/mechanical polishing is the preferred technique for achieving this planarization. With the top surfaces of the conductive lines 12 and the insulating material 21 planarized, these surfaces are coated with a photoresist 24, as shown in plan view in FIG. 13, which is patterned herein with openings spaced along the insulating material 21a in the narrow gap 14a. In the present instance, a single chamber parallel plate reactor is used to etch the pattern in the insulating material 21, as shown by the arrows 25 in FIG. 14, using a conventional fluorinated hydrocarbon gas, herein $CHF_3$, with the result of the etching being shown in FIG. 15. Other gases, such as dicarbon hexafluoride ($C_2F_6$), tricarbon octafluoride ($C_3F_8$), and carbon tetrafluoride are also suitable gases for etching the insulating material 21. Preferably, the etch selectivity of the underlying insulating layer 11 is a less than the selectivity of the insulating material 21a so as to serve as an etch stop when it is reached by the etching gas. Alternatively, if the layer 11 is the same as the material 21a, the etching step can be timed to stop when the etching traverses a predetermined distance.

Figure 9:
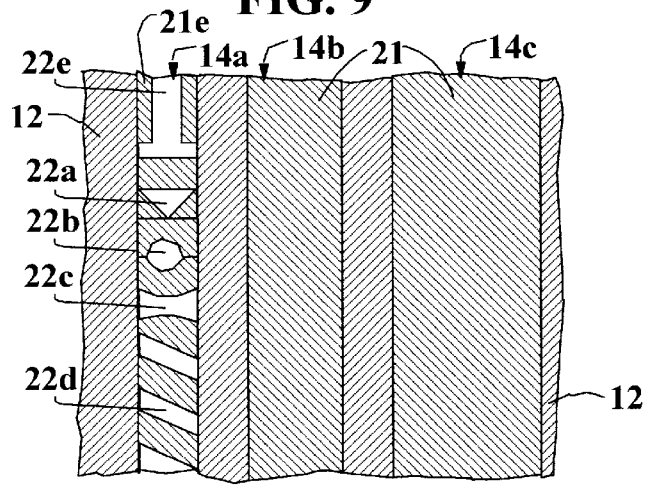
FIG. 9 is a plan view of the conductive lines filled with insulating material and with the narrow gap between the pair of conductive lines having portions of the insulating material removed in different shapes.
Figure 18:
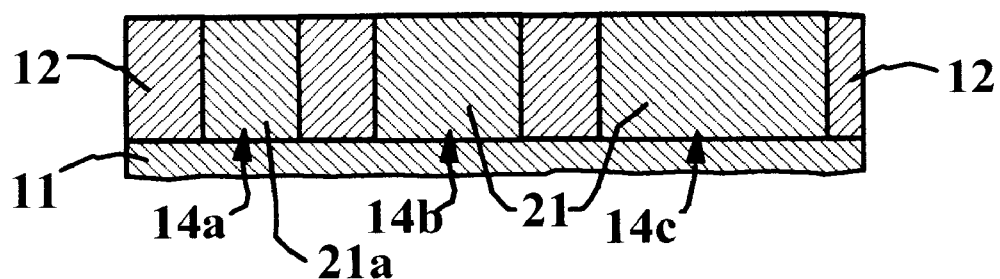
FIG. 18 is a cross-sectional view of FIG. 16 taken along 18—18 of FIG. 16.

Upon completion of the etching of the insulating material 21a, the photoresist is removed by ashing (not shown). The insulating material 21a in the gap 14a is now formed with a plurality of spaces 22a as shown in the plan view of FIG. 16 and the cross-sections of FIGS. 17 and 18. The composite dielectric constant of the insulation in the gap 14a, which is 60% insulating material (silicon oxide—3.9) and 40% space (air—1.00059?) is 2.74. Herein, the spaces 22a are reangular in shape, but other shapes may be used as shown in FIG. 9 and, to provide protection against hillocks, it may be desirable to form the spaces 22 with a shape parallel to the conductive lines so as to leave thin insulating walls 21e on the conductive lines 12. In addition, the process described in FIGS. 10, 11, 12, 13, 14, 15, 16, 17, and 18 only forms the plurality of spaces 22a in the narrow gap where the need for a lower dielectric constant is the greatest, but a plurality of spaced apart spaces also can be formed in the insulating material of the other gaps, such as 14b and 14c.

Figure 19:
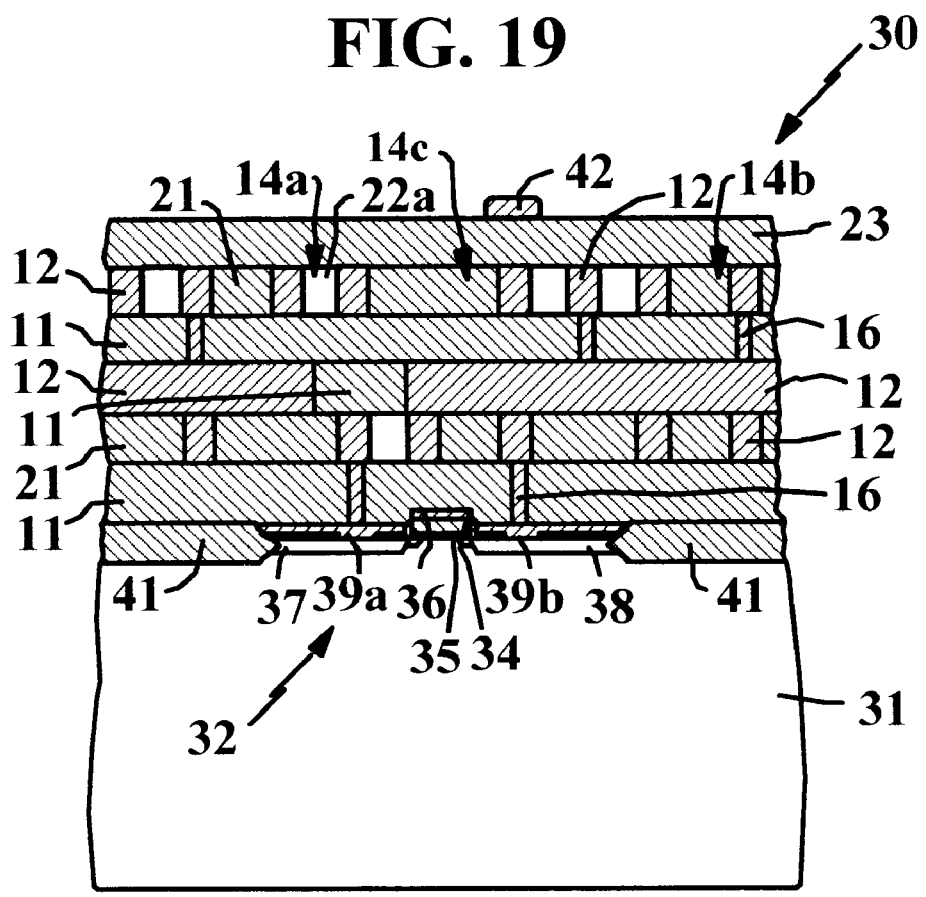
FIG. 19 is a partial cross-sectional view of an integrated circuit with multilevel metallization showing the insulating structure of the present invention with spaces in the insulating material of the narrow gaps.

The method of the present invention yields a novel interconnection structure of an integrated circuit semiconductor device, which in accordance with another aspect of the present invention, comprises at least one interconnection level having at least one narrow gap between a pair of conductive lines with such gap being filled with an insulating material with a plurality of spaces along the conductive line so the composite dielectric constant is not greater than about 3. As partially shown in FIG. 19, an integrated circuit device 30 comprises a silicon body 31 in which a plurality of active and passive devices, herein an exemplary Field Effect Transistor (FET) 32. The FET 32 includes a gate 33 which preferably is a composite of polysilicon 34 on a gate insulator 35 and a metal silicate 36 on the polysilicon surface opposite the insulator 35 for electrical connection into the multilevel interconnections of the integrated circuit device. A source 37 and drain 38, each with Lightly Doped Drains (LDDs), are disposed in the silicon body 31. Metal silicide layers 39a and 39b are formed on the surface of the source 37 and drain 38, which are insulated from the gate 33 by sidewalls 40, for electrical connection into the multilevel interconnections of the integrated circuit device. The FET 32 is isolated from other FETs or other active or passive devices by field oxidized areas 41. The devices, such as FET 32, both in and on the silicon body 30 are interconnected by multilevels of insulating layers 11 and 23 and conductive lines 12. As shown in FIG. 20 vias 16 in contact with the source 37 and drain 38 connect to conductive lines 12 which are connected to other active and passive devices (not shown) and contact pads, such as 42, for input and output signals to and from the integrated circuit device 30. In accordance with the present invention and as shown in FIG. 19, the gaps 14a, 14b, and 14c between the conductive lines 12 are filled with an insulating material 21 with a plurality of spaces 22 along the conductive lines 12 so that the composite dielectric constant is not greater than about 3. Preferably, the insulating material is a silicon oxide and the composite dielectric constant of the oxide and the gas in the spaces is less than about 2.0.

Although this invention has been described relative to specific insulating materials, conductive materials and apparatuses for depositing and etching these materials, it is not limited to the specific materials or apparatuses but only to their specific characteristics, such as being an insulating material with a dielectric constant of not greater than 4. Other materials and apparatus can be substituted for those described herein which will be well understood by those skilled in the microelectronics arts after appreciating the present invention.

Having thus described the invention, what is claimed is:

1. In an integrated circuit having a plurality of semiconductor devices, multilevel interconnections with levels of conductive lines having interconnection therebetween for interconnecting the semiconductor devices comprises:

at least one level of conductive lines with a pair of conductive lines separated by a gap between opposing walls of the lines and having a length dimension in the longest dimension in a direction;

a composite insulation formed from a plurality of solid insulating material portions each having a dimension in said direction less than the length dimension of said pair of conductive lines and disposed in the gap between said opposing walls of said pair of conductive lines and each portion being separated from an adjacent portion by a single space filled with a gas having a dielectric constant of slightly above 1, said solid insulating material portions disposed in the gap being of a size and shape to permit the solid insulating material to support a deposited upper insulating layer but limited in number so that the dielectric constant of the composite insulation of solid insulating material and gas in the spaces over the length of the pair of the conductive line is not greater than about 3.0.

2. The multilevel interconnections of claim 1 wherein said sold insulating material portions has a dielectric constant of not greater than 4.0.

3. The multilevel interconnection of claim 1 wherein at least one of the solid insulating material portions is a pair solid insulating material portions with a space in the approximate center of the gap between the conductive lines and wherein one of the pair of the portions is adjacent one of the opposing walls of the conductive line and the other of the pair is adjacent the other of the opposing walls.

4. The multilevel interconnections of claim 1 wherein each of said spaced has a length dimension between said opposing walls of said pair of conductive lines and each of the spaces has a width dimension between each of said portions of sold solid insulating material, and each of the portions of the said insulating material has a width dimension between the spaces, said width dimension of the spaces being less than the width dimension of the insulating material.

5. The multilevel interconnection of claim 4 wherein the width dimension of each of said portions of the solid insulating material is about equal to the width dimension of each of said spaces.

6. The multilevel interconnection of claim 4 wherein the width dimension of said space is from one-half to two-thirds of the width dimension of said portion of said solid insulating material.

7. The multilevel interconnection of claim 4 wherein the width dimension of the space is greater than two-thirds of the width dimension of said portion of the solid insulating material.

8. The multilevel interconnection of claim 1 wherein the insulating material is a silicon containing material.

9. The multilevel interconnection of claim 1 wherein the shape of the said portions of the insulating material in the gap is different.

10. The multilevel interconnection of claim 4 wherein the number of spaces are more than twice the number of portions of solid insulating material so that the dielectric constant of the composite insulation of the portions of the solid insulating material and the gas in the spaces between the portions over a predetermined distance is less than 2.0.

* * * * *